(12) United States Patent
Duffy et al.

(10) Patent No.: US 8,327,207 B2
(45) Date of Patent: Dec. 4, 2012

(54) MEMORY TESTING SYSTEM

(75) Inventors: Kevin J. Duffy, Highland, NY (US);
William V. Huott, Holmes, NY (US);
Pradip Patel, Poughkeepsie, NY (US);
Daniel Rodko, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 356 days.

(21) Appl. No.: 12/797,181

(22) Filed: Jun. 9, 2010

(65) Prior Publication Data

US 2011/0307747 A1 Dec. 15, 2011

(51) Int. Cl.
*G01R 31/28* (2006.01)

(52) U.S. Cl. .................. 714/733; 714/718; 714/726

(58) Field of Classification Search .............. 365/185.12, 365/189.05; 714/711, 719, 733, 718, 726
See application file for complete search history.

(56) References Cited

U.S. PATENT DOCUMENTS

| | | | |
|---|---|---|---|
| 5,515,024 A | 5/1996 | Ghia et al. | |
| 5,925,143 A * | 7/1999 | Gillis et al. | 714/726 |
| 5,946,233 A * | 8/1999 | Kim et al. | 365/185.12 |
| 5,986,538 A | 11/1999 | Yoon | |
| 6,026,505 A * | 2/2000 | Hedberg et al. | 714/711 |
| 6,510,087 B2 * | 1/2003 | Kudou et al. | 365/189.05 |
| 6,643,807 B1 * | 11/2003 | Heaslip et al. | 714/719 |
| 7,135,893 B2 | 11/2006 | Sugano | |
| 7,305,602 B2 | 12/2007 | Chan et al. | |
| 7,478,297 B2 | 1/2009 | Chan et al. | |
| 7,844,871 B2 * | 11/2010 | Brandt et al. | 714/733 |

* cited by examiner

*Primary Examiner* — David Ton
(74) *Attorney, Agent, or Firm* — Cantor Colburn LLP; William A. Kinnaman, Jr.

(57) ABSTRACT

An array built-in self test (ABIST) system includes a first latch having a first data input, a first scan input and first output and a second latch having a second data input, a second scan input and a second output. The system also includes a first ABIST logic block coupled to the first output that compares a first expected value with a first data value received at the first data input and provided to the first ABIST logic block after a first clock is applied to the first latch. The system also includes a second ABIST logic block coupled to the second output that compares a second expected value with a second data value received at the second data input and provided to the second ABIST logic block after a second clock is applied to the second latch.

16 Claims, 3 Drawing Sheets

MEMORY TESTING SYSTEM

BACKGROUND

The present invention relates to computer memory and, more specifically, to systems and methods for testing computer memory.

Typical computer memory devices include an output capture latch. This latch may be composed of several output latches. The output latch, captures the output of the memory device, typically one address at a time. An "address," as used herein, refers to row or column in an array. Selection of a particular address causes the contents of the row or column to be output. The contents are typically output in parallel. That is, selection of an address for output causes several bits to output to and captured by the output latch. It shall be understood that the output latch may be formed of several individual latches.

Memory devices may be tested by an Array Built in Self Test (ABIST). The ABIST may be implemented, at least in part, in hardware. The ABIST sends test patterns to the memory device. The ABIST then causes the patterns to be output by the memory and compares this output to the test patterns. Typically, the determination of memory validity is, at least initially, determined on a per-address basis.

Preferably, the ABIST should not introduce many (or any) circuit elements into system paths having critical timing constraints. To this end, one approach to implementing an ABIST has been to replicate the output latch and perform the testing based on the data captured by these extra latches. Of course, such a solution increases both power consumption and required space.

SUMMARY

According to one embodiment of the present invention, an array built-in self test (ABIST) system is provided. The system of this embodiment includes a first latch having a first data input, a first scan input and first output and a second latch having a second data input, a second scan input and a second output. The system also includes a first ABIST logic block coupled to the first output that compares a first expected value with a first data value received at the first data input and provided to the first ABIST logic block after a first clock is applied to the first latch. The system also includes a second ABIST logic block coupled to the second output that compares a second expected value with a second data value received at the second data input and provided to the second ABIST logic block after a second clock is applied to the second latch.

According to another embodiment of the present invention, a method of testing a memory is provided. The method includes receiving at a first latch half n data bits from the memory; receiving at a second latch half n different data bits from the memory; providing the n data bits to a first logic block to make a first determination of whether the n data bits match first expected results; storing the first determination in the second latch half; transferring the determination to the first latch half; providing the n different data bits to a second logic block to make a second determination of whether the n different data bits second match expected results; and storing the second determination in the second latch half.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As discussed above, an ABIST sends test patterns to the arrays and can perform a compare at the output of the memory against expected ABIST data. A failure occurs when any bit does not match the expected output. According to one embodiment of the present invention, such a failure may cause a "sticky bit" to be stored in the output latch.

However, the prior art does not provide either a system or method for collecting and compressing memory output data into the output latch during testing without placing additional circuit elements in critical system timing paths or requiring too many additional copies of circuits. Rather, in the prior art either ABIST compare logic was added into the critical timing path coming out of the memory and into the output latch, or an entire additional ABIST capture/compression latch was added in a pipelined manner downstream of the output latch. In either case, there is cost in either critical timing paths or additional copies of register logic. Embodiments disclosed herein enable the use of the normal memory output latch for system use without any additional test logic added to the critical path, while also not requiring any additional capture/compression registers to be added to the chip design.

Figure 1:
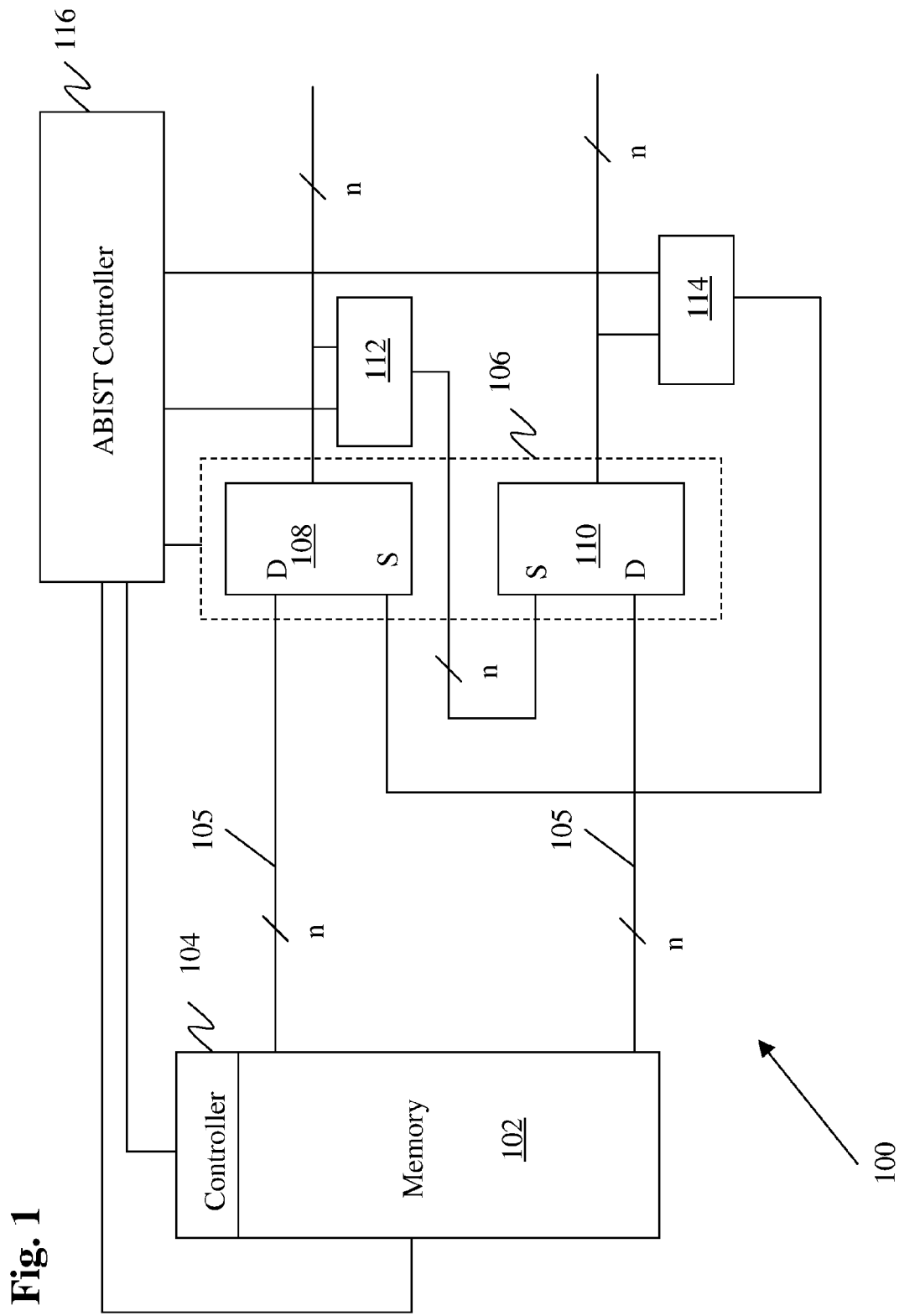
FIG. 1 shows a functional block diagram of a system according to one embodiment of the present invention.

FIG. 1 is a functional block diagram of a system 100 according to one embodiment of the present invention. The system 100 may include a memory array 102. The memory array 102 may include any type of memory array. For example, the memory array 102 may be an SRAM or a DRAM. Selection of a particular address by a memory controller 104 causes all of the bits of the selected address (either a row or a column, depending on orientation) to be provided to an output latch 106 or allows for one or more of the bits to be written to. In the embodiment shown, the memory array 102 has a 2n bit wide output.

The output latch 106 may include several individual latches coupled together. The individual latches may be, for example, formed by two latches in a master-slave configuration. The output latch 106 may be divided into a first latch half 108 and a second latch half 110. In one embodiment, during an ABIST routine, the first latch half 108 may operate in a different operating mode than the second latch half 110. In more detail, during a first time period the individual latches forming the first latch half 108 may operate in a first mode and the second latch half 110 may operate in a second mode. During a second time period, the first latch half 108 may operate in the second mode and the second latch half 110 may operate in the first mode. In embodiment, in the first mode latches receive their input from a data input D and in the second mode data is received on a scan input S. Of course, the individual latches may have two different inputs.

The outputs the first latch half 108 and the second latch half 110 are, respectively, provided to ABIST logic blocks 112 and 114. The outputs are also provided to other locations. In such a configuration, the ABIST logic does not, in a normal operating mode, interfere with the normal operation or introduce logic into critical timing paths.

The ABIST logic blocks 112 and 114 are utilized to compare the output of the memory 102 with the ABIST expected output and are controlled by an ABIST controller 116. The ABIST controller 116 provides the test pattern to the memory 102 and then provides the expected result to the ABIST logic blocks 112 and 114 for comparison.

In operation, data from memory array 102 initially feeds directly into first latch half 108. The second latch half 110 stores the results of sticky-bit compare performed in the ABIST logic block 114 against the expected ABIST data received from the ABIST controller 116. In one embodiment, the second latch half 110 receives the results via its scan input S. As such, logic blocks 112 and 114 are within the scan path and, accordingly, do not impact system performance into data path of capture latch 106 during normal operation. During a second pass, the operation of the two latch halves 108 and 110 is reversed to fully test and verify the memory array 102. In particular, during the second pass, data from memory array 102 feeds into second latch half 110. The first latch half 108 stores the results of sticky-bit compare performed in the ABIST logic block 116 against the expected ABIST data received from the ABIST controller 116. In one embodiment, the first latch half 108 receives the results via its scan input S.

Effectively half of the data received by the capture latch 106 is tested in the first pass while using the second latch half 110 to capture/compress the results and then the second pass tests the second half of the data received by the capture latch 106 by using the first latch half 108 for ABIST capture/compression.

All fail data results are retained from the first pass by implementing a transfer step between the first and second halves of the test that transfers the results from the first pass stored in the second latch half 110 to the first latch half 108. This may allow for only one scan being needed to capture the entire result of both passes. Advantageously, this may allow for the outputs of the memory 102 to be captured at-speed in the system data ports of the output latches (with no test logic in the critical path), while using the non-critical scan path into the other half of the output latches for the ABIST compare/compression function. Thus, no additional registers are added to the design and no system critical timing paths have to add any additional test logic.

Figure 2:
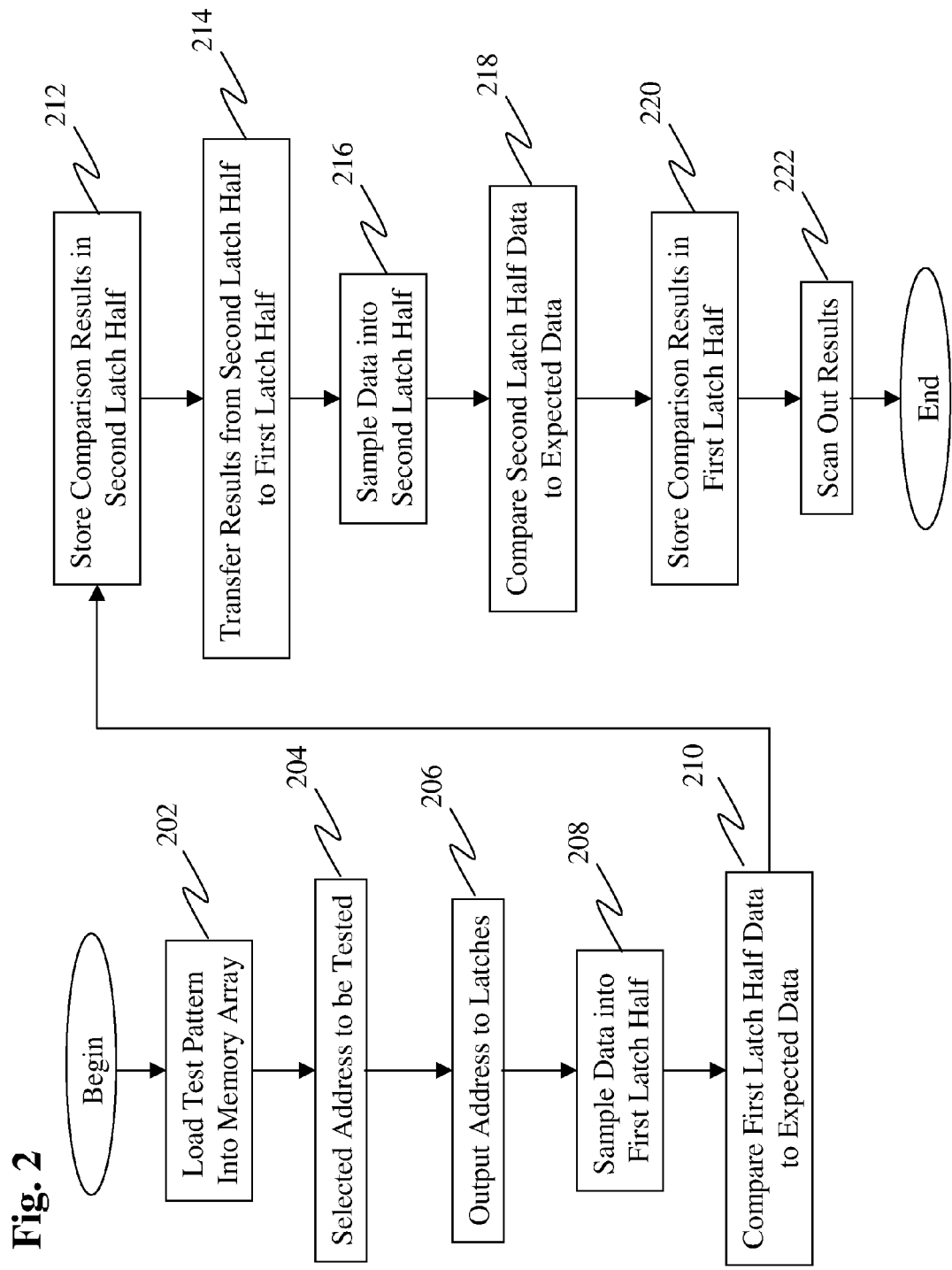
FIG. 2 shows a method according to one embodiment.

FIG. 2 is a flow diagram of a method of operating the system 100 shown in FIG. 1. Accordingly, the description of FIG. 2 will also refer to the system 100 of FIG. 1.

At block 202 the ABIST controller 116 may cause a test pattern to be loaded into one or more addresses of the memory array 102. This may be accomplished by the ABIST controller 116 providing one or more patterns to be written to one or more addresses within the memory array 102. Of course, the controller 104 may be utilized to control such operations.

At block 204 the ABIST controller 116 specifies an address to be tested and provides that address to the memory array 102. At a block 206, the data contained in the memory array 102 is provided to the outputs 105 of the memory array. The outputs 105 of the memory array 102 may provide data to the data inputs D of the capture latch 106.

At block 208, the ABIST controller 116 causes the first latch half 108 to sample data in on its data input D. This may be done, for example, by providing a first clock signal to the first latch half 108.

The sampled data is then compared with expected data received from the ABIST controller 116 in first ABIST logic block 112 at block 210. The result of the comparison performed at block 210 is stored in the second latch half 110 at block 212. The result may be stored by having the second latch half 110 sample its scan input S. This may be accomplished by providing a second clock signal to the second latch half 110 that is different than the first clock signal. For purposes of this discussion it shall be assumed that the logic blocks output a logical 1 when the output of the memory array 102 does not match an expected output.

At block 214, the results stored in the second latch half 110 are transferred to the first latch half 108. There are a variety of ways in which this may be accomplished. For example, in the event that the ABIST logic includes an XOR operation, the values in each of the individual latches forming the second latch half 110 may be XOR'd with logical 0's. In this manner, any 1 is transferred to the first latch half 108. The first latch half 108 may then receive the second clock signal causing it to read in the result of the transfer through its scan input S.

At a block 216, the ABIST controller 116 causes the second latch half 110 to sample data in on its data input D. This may be done, for example, by providing the first clock signal to the second latch half 110.

The sampled data is then compared with expected data received from the ABIST controller 116 in second first ABIST logic block 114 at block 218. The result of the comparison performed at block 216 is stored in the first latch half 110 at block 220. The result may be stored by having the first latch half 108 sample its scan input S.

In one embodiment, the individual latches may be chained together to allow for a scan out operation to be performed. In such an embodiment, at block 222, the results of the comparisons may be scanned out.

Figure 3:
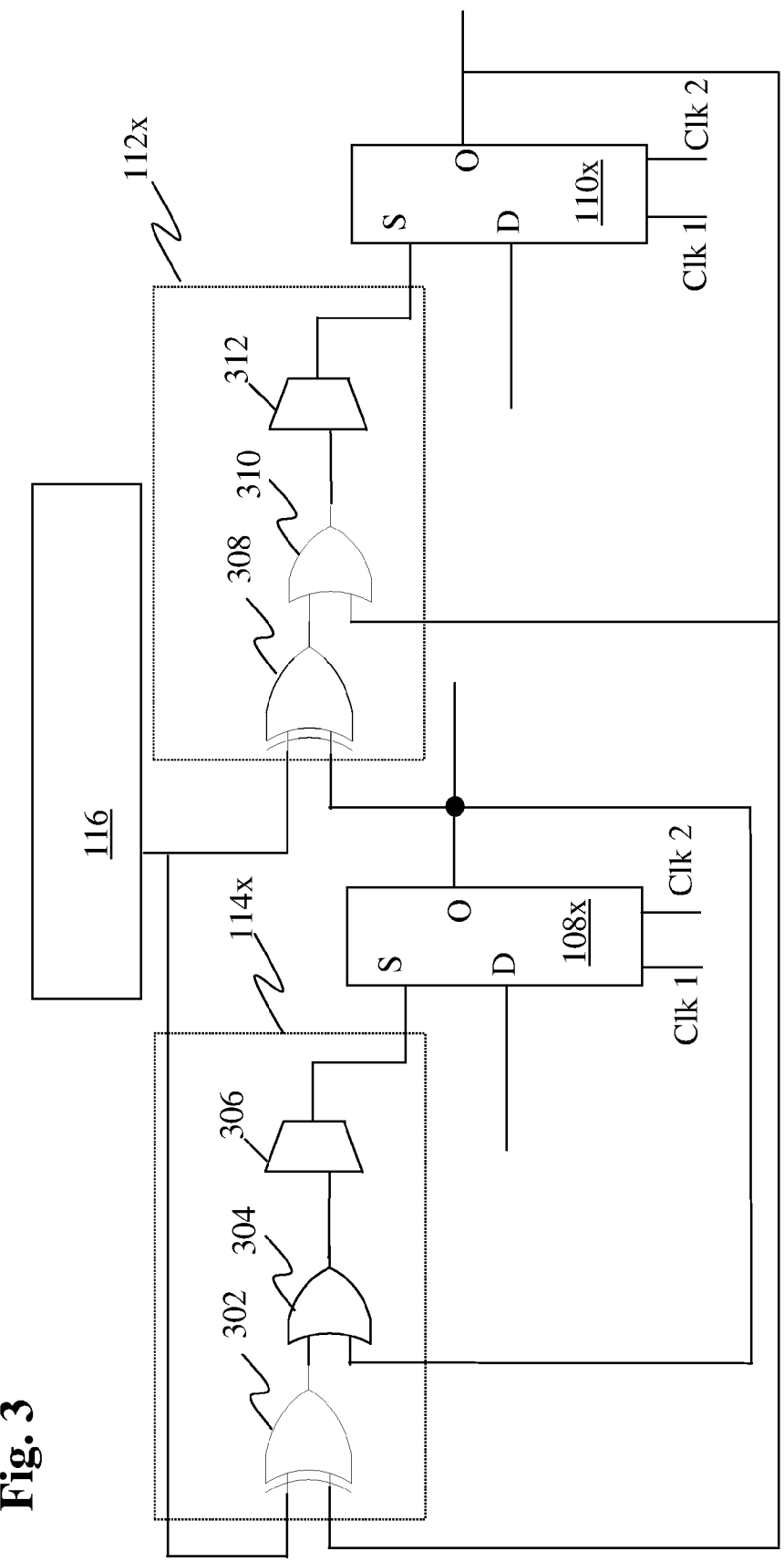
FIG. 3 shows a more detailed view of a portion of the system of FIG. 1.

FIG. 3 shows a portion of the circuit shown in FIG. 1. The portion shown includes the latches and ABIST logic for two individual bits. The first bit may have been connected to the first latch half 108 in FIG. 1 and the second bit may have been connected to the second latch half 110. Assuming each latch half is formed of at least n latches where n is greater than or equal to x, FIG. 3 shows the xth latch 108$x$ in the first latch half and the xth latch 110$x$ in the second latch half.

The first latch 108$x$ and the second latch 110$x$ both include at least two inputs. These inputs include a scan input S and a data input D. The first latch 108$x$ and the second latch 110$x$ may also include an output O.

The data inputs D are coupled to the output of a memory array in one embodiment. Each latch clocks in from either S or D based on the clock applied. For purposes of the this explanation, application of the first clock Clk 1 causes information on the data input D to be clocked to the output O. Similarly, application of the second clock Clk 2 causes information on the scan input S to be clocked to the output O.

In one embodiment, the first latch 108$x$ and the second latch 110$x$ may both also include a scan output used when scanning the results of the ABIST out to another device. The connections and operation of latches in a scan mode is well known and not discussed in more detail herein.

During an ABIST, the output of the first latch 108$x$ is provided to a first ABIST logic block 112$x$. The output of the first ABIST logic block 112$x$ is provided to the scan input S of the second latch 110$x$. In more detail, a data value is presented on the data input D of the first latch 108$x$. The ABIST controller, at least in part, causes the first clock Clk 1 to be applied to the first latch 108. Clk 1 causes the data present at data input D to be presented to the output O of the first latch 108x. This value is then compared with an expected value received from the ABIST controller 116 by XOR gate 308 in the first ABIST logic block 112x. The result of this comparison may then be passed through an OR gate 310. The OR gate is utilized to make any determination that a bit error has occurred a sticky determination. In particular, to the extent that the second latch 110x has received a determination that a mismatch has occurred, the 1 is forced to stay in the latch until the second latch 110x is clocked by the first clock (i.e., until it reads in a data value from its data input D rather than its scan input S). The first ABIST logic block 112x may also include a multiplexer 312 that selects either a scan operation mode or a compare mode based on a signal received from the ABIST controller 116 or another device capable of asserting a scan mode signal. This multiplexer may always select the output of the OR gate during an ABIST.

After the value is stored in the second latch 110x by application of the second clock CLK to the second latch 110x, it is transferred to the first latch 108x during a transfer step. The transfer may be accomplished by asserting the second clock to both the first latch 108x and the second latch 110x. At the same time, all zeros may be applied to each XOR gate and, in particular, to XOR gate 302 of the second ABIST logic block 114x. This will allow whatever value was in the second latch 110x to pass to the scan input S of the first latch 108x. This value is then clocked into the first latch 108x by application of the second clock Clk 2.

The second latch 110x then has its data input D clocked in by application of the first clock Clk 1. This value is then compared to the expected value by XOR gate 302. In the event the first latch 108x already has 1 stored therein (as a result of the transfer), this 1 will not be overwritten, regardless of the result of the XOR, because it is fed back into OR gate 304. As above, the second ABIST logic block 114x may also include a multiplexer 306 for use in scanning.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An array built-in self test (ABIST) system comprising:
   a first latch having a first data input, a first scan input and first output;
   a second latch having a second data input, a second scan input and a second output;
   a first ABIST logic block coupled to the first output that compares a first expected value with a first data value received at the first data input and provided to the first ABIST logic block after a first clock is applied to the first latch; and
   a second ABIST logic block coupled to the second output that compares a second expected value with a second data value received at the second data input and provided to the second ABIST logic block after a second clock is applied to the second latch.

2. The ABIST system of claim 1, wherein the first clock is different than the second clock.

3. The ABIST system of claim 2, wherein the first clock causes the first latch and the second latch to sample first date input and the second data input, respectively, and the second clock caused the first latch and the second latch to sample the first scan input and the second scan input, respectively.

4. The ABIST system of claim 1, further comprising an ABIST controller coupled to the first ABIST logic block and the second ABIST logic block that provides the firs and second expected valued.

5. The ABIST system of claim 4, wherein the first ABIST logic block includes an XOR gate that receives the first expected value and compares it to the first data value.

6. The ABIST system of claim 5, wherein the first ABIST logic block further includes an OR gate coupled between an output of the XOR gate and the second scan input.

7. The ABIST system of claim 5, wherein the second ABIST logic block includes an XOR gate that receives the second expected value and compares it to the second data value.

8. The ABIST system of claim 7, wherein the second ABIST logic block further includes an OR gate coupled between an output of the XOR gate and the second scan input and wherein an input of the OR gate is coupled to the first output.

9. A method of testing a memory, the method comprising:
   receiving at a first latch half n data bits from the memory;
   receiving at a second latch half n different data bits from the memory;
   providing the n data bits to a first logic block to make a first determination of whether the n data bits match first expected results;
   storing the first determination in the second latch half;
   transferring the determination to the first latch half;
   providing the n different data bits to a second logic block to make a second determination of whether the n different data bits second match expected results; and
   storing the second determination in the second latch half.

10. The method of claim 9, wherein providing the n data bits to the first logic block includes providing a first clock to the first latch half.

11. The method of claim 10, wherein providing the n different data bits to the second logic block includes providing a second clock, different from the first clock, to the second latch half.

12. The method of claim 11, wherein the transferring includes providing the second clock to both the first latch half and the second latch half.

13. The method of claim 9, further comprising:
scanning out the results.

14. The method of claim 9, wherein storing the second determination in the second latch half does not overwrite any logical one of the first determination after it has been transferred to the first latch half.

15. The method of claim 9, wherein the first determination is made with an XOR gate coupled to the first output and an ABIST controller.

16. The method of claim 9, wherein transferring includes simultaneously providing a plurality of logical zeros to a plurality of XOR gates within the first logic block.

* * * * *